US006714092B1

(12) United States Patent
Ramesh

(10) Patent No.: US 6,714,092 B1
(45) Date of Patent: Mar. 30, 2004

(54) SUPPLY NOISE FILTER FOR CLOCK GENERATOR

(75) Inventor: Srithar Ramesh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 09/703,723

(22) Filed: Nov. 2, 2000

(51) Int. Cl.[7] .............................. H03H 5/12; H04B 3/26

(52) U.S. Cl. .............................................. 333/12; 333/181

(58) Field of Search .......................... 333/12, 181, 182, 333/184, 185; 363/47, 48

(56) References Cited

U.S. PATENT DOCUMENTS 3,246,229 A * 4/1966 Lloyd .......................... 333/181
4,559,592 A * 12/1985 Muller .................... 363/21.15
4,593,256 A * 6/1986 Bickley .................. 331/117 R
5,068,631 A * 11/1991 Vince ....................... 333/12 X
5,088,016 A * 2/1992 Vinciarelli et al. ........... 363/15
5,173,670 A * 12/1992 Naito et al. ................. 333/184
5,812,384 A * 9/1998 Ramakrishnan et al. .... 333/185
5,828,558 A * 10/1998 Korcharz et al. ............. 363/20
5,905,417 A * 5/1999 Norte et al. .................. 333/12
6,152,775 A * 11/2000 Pavlovic ..................... 439/441
6,366,443 B1 * 4/2002 Devoe et al. ............... 361/313

OTHER PUBLICATIONS

Vishay Sprague, Solid Tantalum Chip Capacitors Tantamount Conformal Coated, catalog 1992, pp. 114–123.*
TDK, EMC Components Ferrite Beads SMD, catalog 1996, pp. 1–4.*

* cited by examiner

*Primary Examiner*—Robert Pascal
*Assistant Examiner*—Dean Takaoka
(74) *Attorney, Agent, or Firm*—Kenyon & Kenyon

(57) ABSTRACT

A circuit for removing noise from the power supply of a clock generator. Switching regulator noise from the voltage regulator section can affect a clock chip when it is carried through the power plane or ground plane. In order to remove this, a ferrite bead is placed along the voltage supply line. A bulk capacitor with low equivalent series resistance is connected from the output side of the ferrite bead to ground. By properly selecting the size of the bead and capacitor, the noise is reduced. The result is that the clock does not drift so that functional failures are reduced.

24 Claims, 6 Drawing Sheets

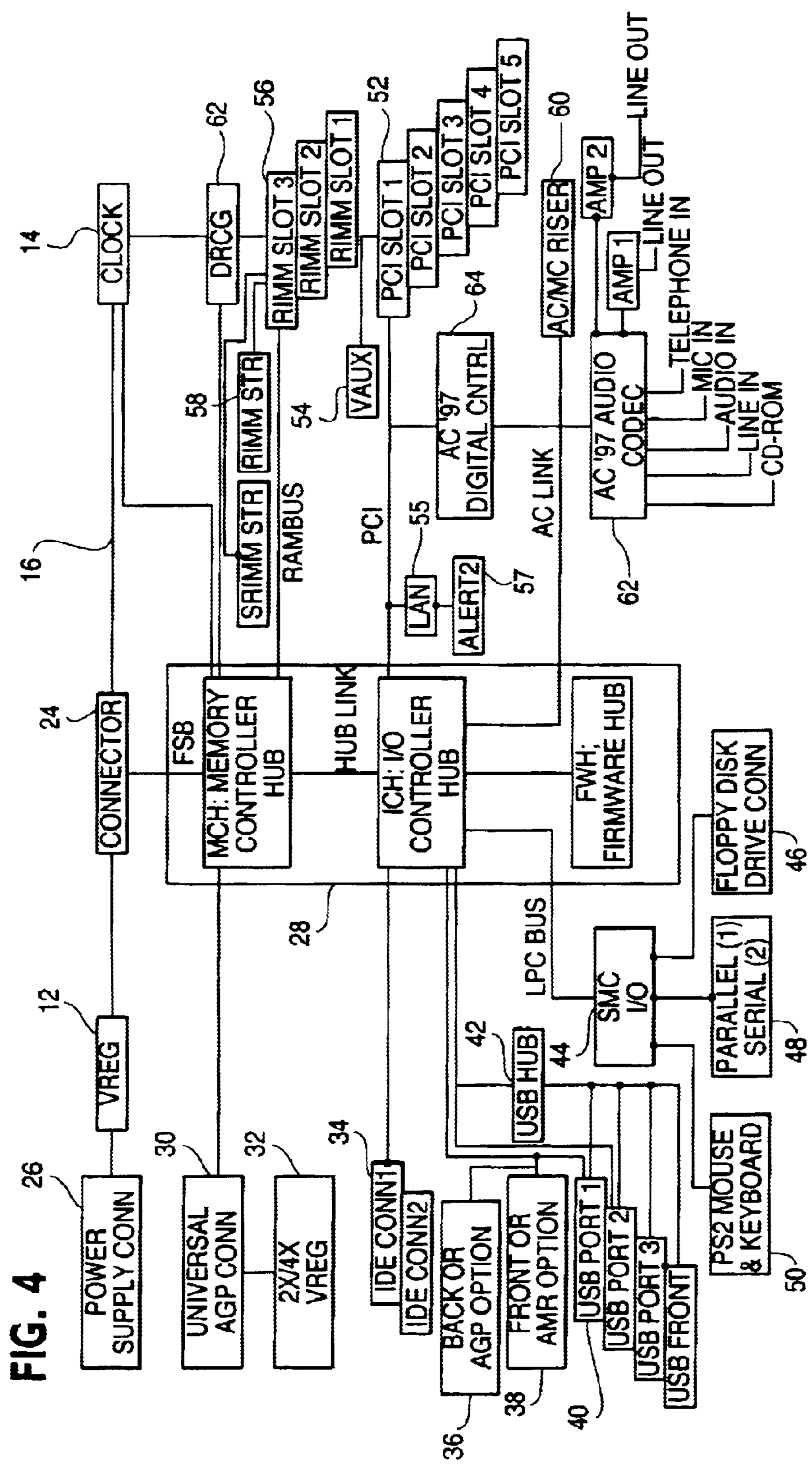
FIG. 4
POWER SUPPLY CONN
VREG
CONNECTOR
CLOCK
DRCG
RIMM SLOT 3
RIMM SLOT 2
RIMM SLOT 1
PCI SLOT 1
PCI SLOT 2
PCI SLOT 3
PCI SLOT 4
PCI SLOT 5
AC/MC RISER
AMP 2
LINE OUT
AMP 1
LINE OUT
TELEPHONE IN
MIC IN
AUDIO IN
LINE IN
CD-ROM
AC '97 AUDIO CODEC
AC '97 DIGITAL CNTRL
VAUX
RIMM STR
SRIMM STR
RAMBUS
PCI
LAN
ALERT2
AC LINK
FSB
MCH: MEMORY CONTROLLER HUB
HUB LINK
ICH: I/O CONTROLLER HUB
FWH: FIRMWARE HUB
LPC BUS
SMC I/O
FLOPPY DISK DRIVE CONN
PARALLEL (1) SERIAL (2)
PS2 MOUSE & KEYBOARD
USB HUB
UNIVERSAL AGP CONN
2X/4X VREG
IDE CONN1
IDE CONN2
BACK OR AGP OPTION
FRONT OR AMR OPTION
USB PORT 1
USB PORT 2
USB PORT 3
USB FRONT
12
14
16
24
26
28
30
32
34
36
38
40
42
44
46
48
50
52
54
55
56
57
58
60
62
64

CLOCK
14
3.3V
2.5V
VCC3
OUT
IN
64
68
66
18
20
84
12

12
70
70
72
Vcc
Vcc
IN
OUT
G
D
S
1
2
3
4

SUPPLY NOISE FILTER FOR CLOCK GENERATOR

FIELD

The present invention is directed to a device for removing noise from a power supply. More particularly the present invention is directed to a device for removing noise from a power supply before it reaches a clock generator.

BACKGROUND

Continuing developments in the semiconductor field have allowed circuit elements to shrink smaller and smaller. One result of this is that the particular circuit elements are in closer and closer proximity. While this is generally advantageous in that the elements require less power, less cooling and less space, sometimes deleterious effects also occur. One particular result of placing elements in close proximity is that noise is more easily carried from one section of a device to another.

One particular place where this occurs is in the voltage regulator section of the voltage source on a motherboard of a processor platform. Switching regulator noise is often generated in this section. This noise may be carried through the power plane or ground plane to other circuits which are mounted on the motherboard. In particular, the clock chip phase lock loop circuit is susceptible to this type of noise. Since higher frequencies are now involved, the switching noise is also of higher frequency and accordingly is more likely to cause problems than in the past. If switching noise at about 150 KHz enters the clock chip, the clocks may start drifting up to 3% of their nominal frequency. This can affect the signal quality and jitter resulting in a functional failure. Traditional decoupling capacitors can reduce some of the noise. However, if insufficient numbers of capacitors are provided, the clock is susceptible to drift. Further, as the switching circuits get closer to the clock chip, the effect will increase, resulting in more failures. While increasing the number of decoupling capacitors around the clock generator and voltage regulator section will help to reduce the noise, it will increase the cost and size of the motherboard.

FIG. 1 shows the basic arrangement 10 of a circuit having a voltage source 12 and a clock circuit 14. The voltage source provides a voltage input 16 to the clock. The clock then generates output clock signals. Both the voltage source and the clock are grounded. Noise can travel either through the grounding connection or through the voltage connection.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 4 is a block diagram showing an example advantageous arrangement of a motherboard of a processor;

DETAILED DESCRIPTION

Figure 1:
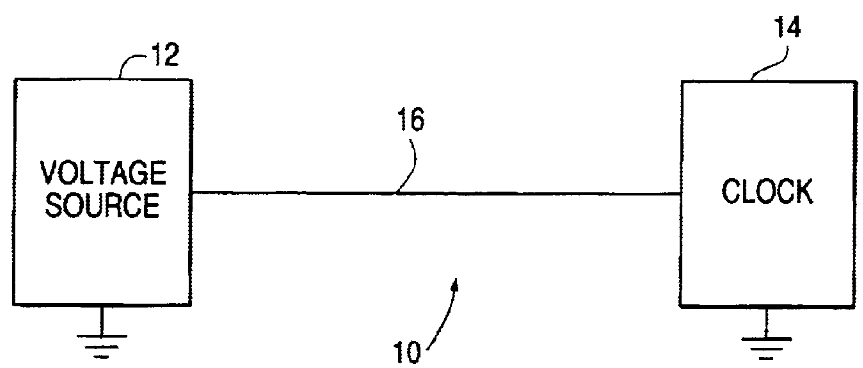
FIG. 1 shows a disadvantageous arrangement of a voltage source and clock circuit.

Before beginning a detailed description of the subject invention, mention of the following is in order. When appropriate, like reference numerals and characters may be used to designate identical, corresponding or similar components in differing figure drawings. Further, in the detailed description to follow, example sizes/mod is/values/ranges may b given, although the present invention is not limited to the same. As a final note, well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Reference in the specification to "one embodiments" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Briefly, the advantageous arrangements of the present device are achiev d by providing a ferrite bead on a voltage line from the voltage source and a bulk capacitor of particular size connected between the ferrite bead and ground so that noise is removed from the voltage line before it reaches the clock circuit. The ferrite bead also interacts with the electromagnetic signature of the noise signal to isolate the noise from the clock.

Figure 2:
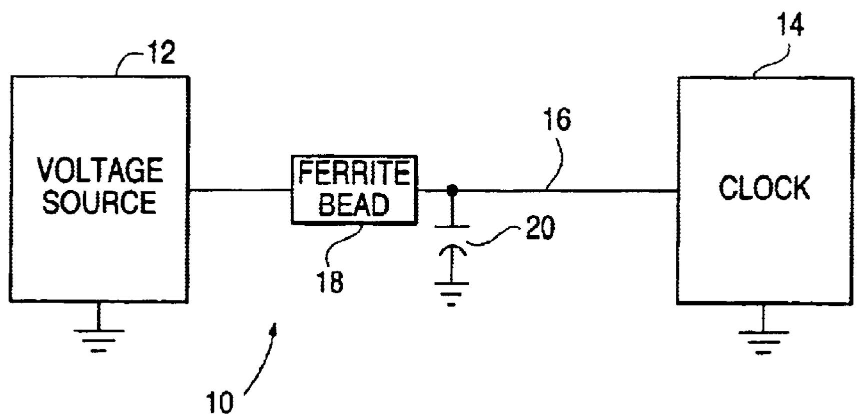
FIG. 2 shows an example advantageous arrangement of a voltage source and clock circuit.

FIG. 2 shows a device 10 as including the same voltage source 12 and clock 14 arrangement as described above. The voltage line 16 continues to provide a voltage to the clock. Both the voltage source and clock are also grounded. However, in this arrangement, a ferrite bead 18 is placed along voltage line 16. A bulk capacitor 20 is connected between the output side of the ferrite bead and ground. By selecting the proper size of ferrite bead and bulk capacitor and the proper layout and routing, the combination will form a resistor divider circuit in regard to the switching noise and thereby cut down the noise carried to the clock circuit. The key to this arrangement is the proper sizing of the ferrite bead for noise isolation and the use of a bulk decoupling capacitor with low equivalent series resistance. The use of a low resistance of the capacitor makes the resistor divider circuit more effective in removing the noise signal. In particular, the capacitor chosen is a "D" case 22uf tantalum device instead of the normally used "B" case tantalum. The "D" case has a r sistance of 0.8 ohms compared to 3 ohms of the "B" case type, due to the low equivalent series resistance of the "D" case. For this arrang ment, the ferrite bead has a DC resistance of 0.3 ohms. This arrangement of the bead and capacitor having these values cuts the low frequency noise by 20% compared to a "B" case type. The selected arrangement, when measured by a spectrum analyzer, had a 30 dB attenuation to the nearest drift frequency from the fundamental frequency on the time domain. This may be compared to 24 dB for a "B" case and 26 dB for a "C" case. Functional failures were observed when using either a "B" or "C" case capacitor which did not occur when a "D" case capacitor was used.

As described above, although the "D" case capacitor had the best results, if the clock generator has a good noise rejection design, a "B" case capacitor can be used to save cost.

It is also possible to use a dual capacitor site to accommodate both a "B" case and a "D" case decoupling capacitor. As is well know, the "D" case is the largest case size, whereas "B" is a smaller case size. Thus, use of the "D" case would normally be avoided because of the increase in size necessary. However, this will often be worth the additional space due to the better noise rejection as described above.

Figure 3:
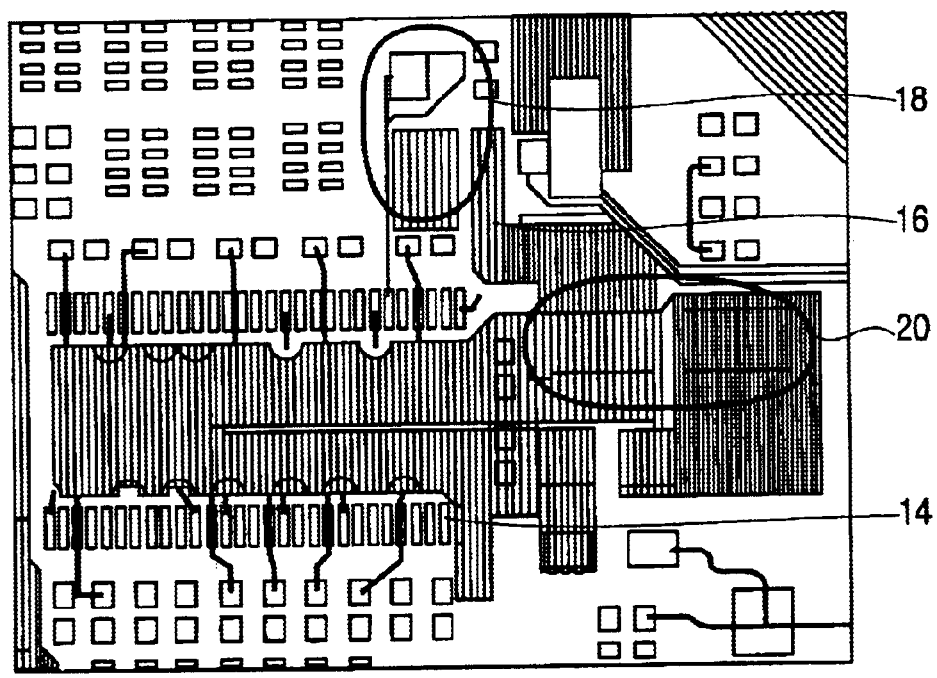
FIG. 3 shows the layout of the advantageous arrangement shown in FIG. 2.

FIG. 3 shows the layout of a circuit including the ferrite bead and bulk capacitor. As discussed above, the particular layout and routing as shown is important in helping to eliminate the noise. In particular, the thick power trace is routed to the ferrite bead first and then the trace is connected to the bulk capacitor so that it looks like a resistor divider before routing it to the clock chip. It is best to place the ferrite bead and capacitor close to the clock circuit for it to be most effective. However, the connection should not be at the pins of clock chip itself.

FIG. 4 is a block diagram of the motherboard for a processor in which the embodiment may be used. The clock 14 is connected to the voltage regulator 12 by way of voltage line 16. These are also joined through connector 24 which is a processor block. Power is supplied to the voltage regulator from a power supply connector 26. Although they are not separately shown in this larger block diagram, the ferrite bead 18 and capacitor 20 would be present in the block indicated as connector 24.

The motherboard also contains a central unit 28 which includes the I/O controller hub a firmware hub and a memory controller hub. This unit is also connected to connector 24. It is also connected to a universal AGP connector 30 which is connected to a 2X/4X voltage regulator 32. The central unit is also connected to IDE connectors 34. These are specifically connected to the I/O controller hub as are other units such as the back or AGP option 36, the front or AMR option 38 and the series of USB ports 40. These ports are connected through a USB hub 42. The I/0 controller hub is also connected to an SMC I/O device 44. This device is used to connect the controller hub to a floppy disc drive connector 46, parallel and serial ports 48, and a mouse and keyboard connection 50.

The I/O controller hub is also connected to a series of PCI slots which are connected to an auxiliary voltage unit 54. A local area network connection 55 and an alert device 57 are also connected to the same line as the PCI slots. An AC/MC riser is connected through an AC link to the I/O controller hub also.

An audio CODEC is connected to a CD-ROM, a line in, an audio line in, a microphone line in, and a telephone line in. It is also connected to two amplifiers connected to outlines. This CODEC 62 is connected to a digital control 64 which is connected to the PCI line. The memory controller hub is connected by way of a memory bus, which may conform to a memory bus architecture developed at least in part by RAMBUS, Incorporated, to a series of RIMM slots 56. The RIMM slots are also connected to other units such as RIMMSTR 58, SRIMMSTR 60 and DRCG 62. The latter is also connected to the memory controller hub.

Figure 5:
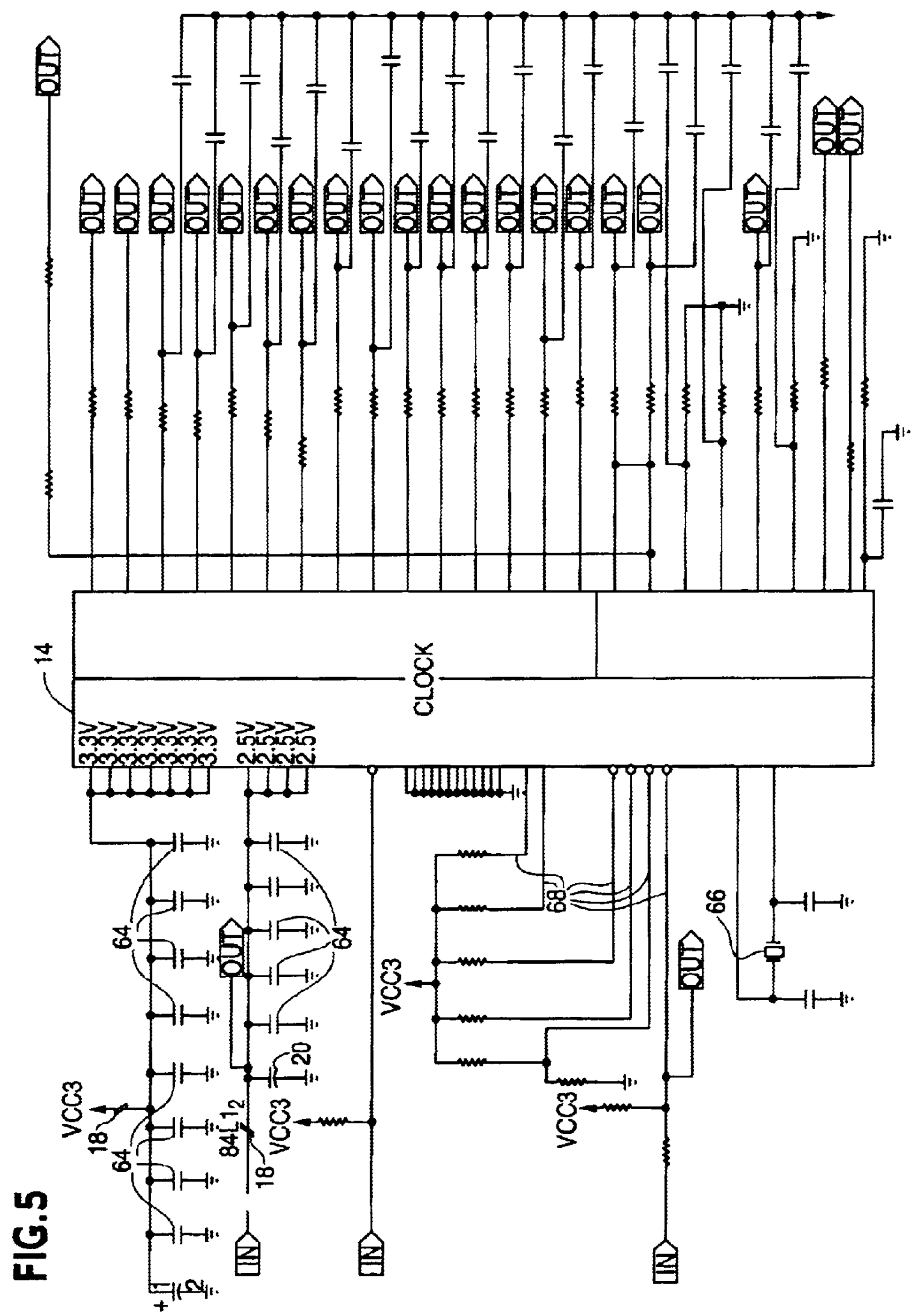
FIG. 5 is a schematic diagram of an example advantageous clock circuit.

FIG. 5 is a schematic diagram of the clock circuit 14. In the upper lefthand side of the figure, the connection VCC 3 coming from the voltage regulator 12 is shown as being connected to ferrite bead 18. The output (or side 2) of the ferrite bead is connected to ground through a series of capacitors. The capacitor on the lefthand side 20 is the bulk capacitor described previously. The remaining capacitors 64 are decoupling capacitors. The output side of the ferrite bead is also connected to the 3.3 volt input to the clock chip 14. The clock chip also has a 2.5 volt input with a similar arrangement of a ferrite bead, bulk capacitor and five decoupling capacitors. The lock is also connected to a crystal oscillator 66 in the lower 1 ft hand part of the Figure. Various control signals 68 are also provided to the clock chip on the lefthand side of the figure. On the right-hand side of the chip, a number of clock signals are being output to be used by various parts of the motherboard.

Figure 7:
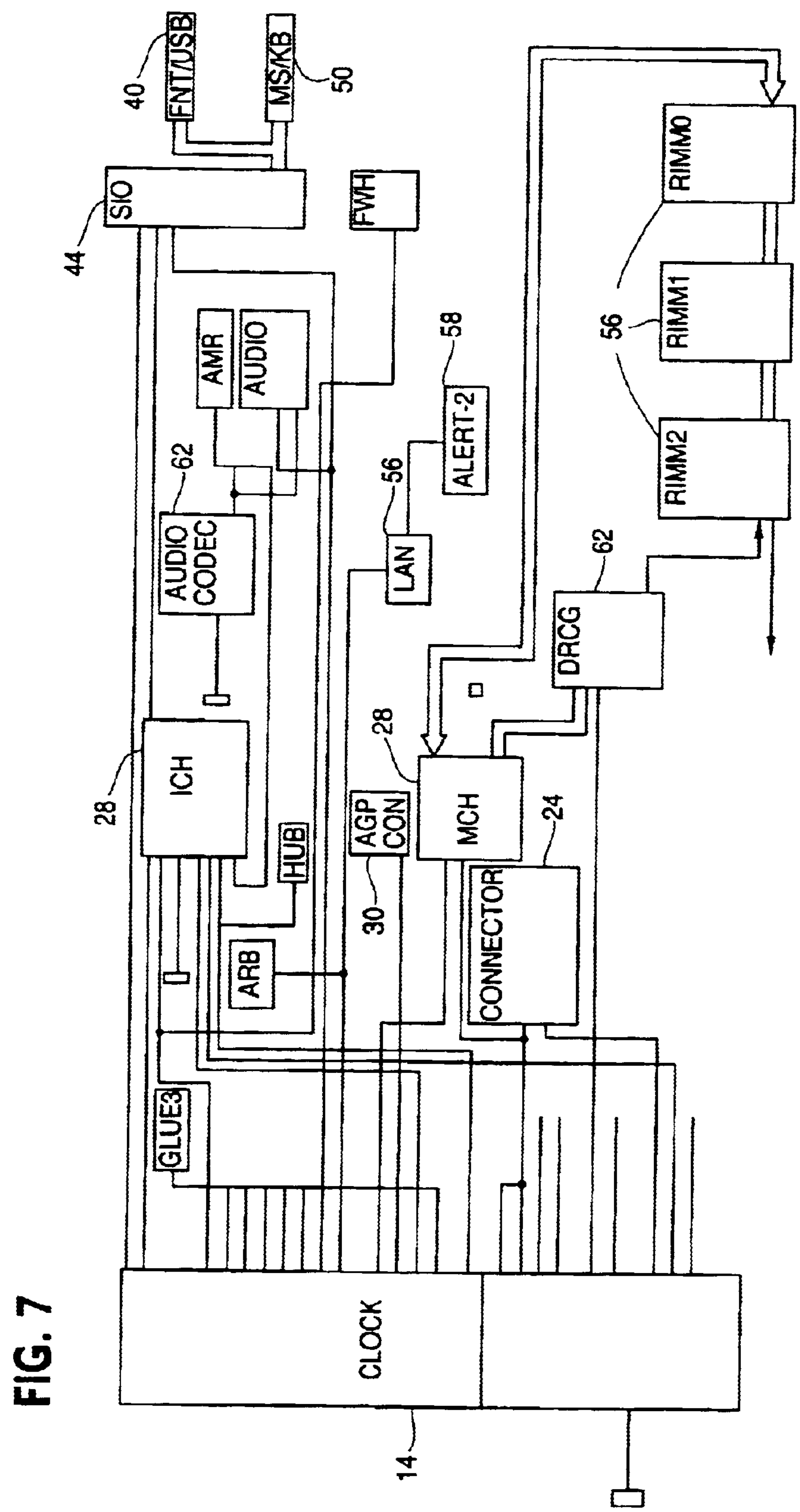
FIG. 7 is a block diagram showing an advantageous arrangement of a clock circuit and circuits which receive clock signals.

FIG. 7 shows many of these connections. That is, the various output lines shown on the right-hand side of FIG. 5 are shown as being connected to various blocks on the motherboard. The particular clock frequencies are also listed in this figure.

Figure 6:
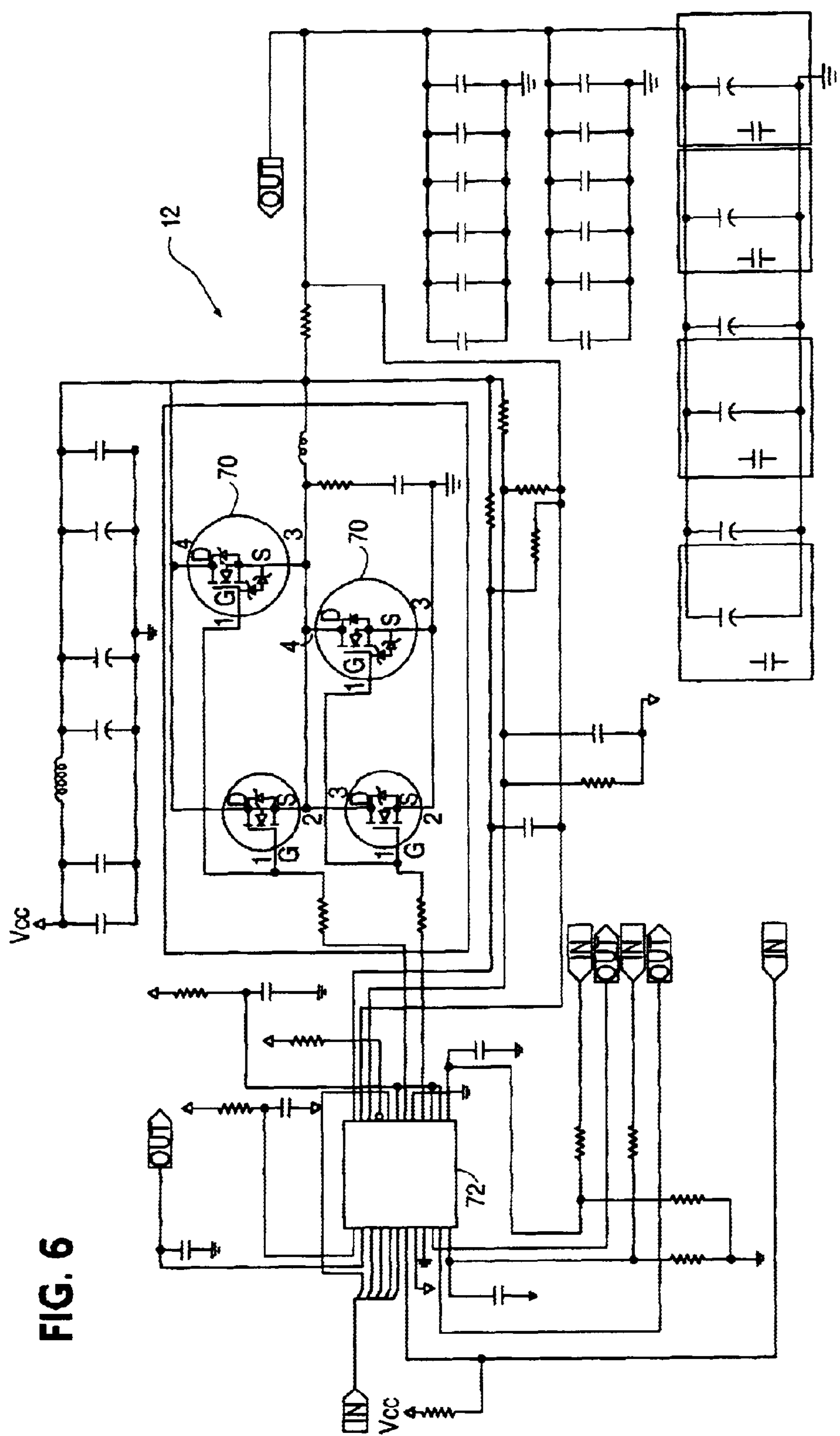
FIG. 6 is a circuit diagram of an advantageous arrangement of a voltage regulator.

FIG. 6 is a schematic diagram of the voltage regulator 12. This system includes two FETS 70 which generate about 1.8 volts using the five volt power from the motherboard. It is this 1.8 volts which is used by processor connector 24. The voltage controller 72 generates switching pulses for the FET 70. The pulse is generated by the voltage controller to cause the FET's to switch at about 150 KHz. This rapid switching cr ates switching noise at this frequency.

The switching noise for the voltage regulator can be carried to the clock 14 through either the power line or through the ground line. Noises from other parts of the motherboard may also be received in the clock chip. However, this 150 KHz switching noise is the most prominent. When this noise reaches the clock chip the phase lock loop circuit in the chip may receive the noise if it is not appropriately blocked out. When this noise is received by the phase lock loop circuit, the result the drifting of the output clocks and as a result the clocks have bad signal quality.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A circuit for removing noise on a regulated voltage line, comprising:

a ferrite bead connected in the regulated voltage line, the ferrite bead having a first resistance; and a bulk capacitor with low equivalent series resistance connected between an output side of the ferrite bead and ground.

2. The circuit according to claim 1, wherein the capacitor is a D case tantalum bulk capacitor.

3. The circuit according to claim 2, wherein the capacitor has the series resistance of approximately 0.8 Ohms.

4. The circuit according to claim 1, wherein the ferrite bead has the first resistance of approximately 0.3 Ohms.

5. A voltage supply device comprising:

a voltage source including a voltage regulator section producing a voltage output;

a ferrite bead connected at one side to the voltage output and forming at another side an output, the ferrite bead having a first resistance; and a capacitor with low equivalent series resistance connected between the output and ground;

where switching regulator noise from the voltage regulator section is removable by the ferrite bead and capacitor.

6. The voltage supply device according to claim 5, wherein the capacitor is a D case tantalum bulk capacitor.

7. The voltage supply device according to claim 5, wherein the capacitor has the series resistance of approximately 0.8 Ohms.

8. The voltage supply device according to claim 5, wherein the ferrite bead has the first resistance of approximately 0.3 Ohms.

9. A method of removing switching regulator noise from a regulated voltage supply line, comprising:

connecting a ferrite bead in the regulated voltage input line, the ferrite bead having a first resistance; and connecting a bulk capacitor with low equivalent series resistance between an output side of the ferrite bead and ground.

10. The method according to claim 9, wherein the capacitor is a D case tantalum bulk capacitor.

11. The method according to claim 10, wherein the capacitor has the series resistance of approximately 0.8 Ohms.

12. The method according to claim 9, wherein the ferrite bead has the first resistance of approximately 0.3 Ohms.

13. A voltage source for a clock circuit, comprising:

a voltage regulator having a regulator output;

a ferrite bead connected to the regulator output of the voltage regulator and having an output, the ferrite bead having a first resistance; and a bulk capacitor with low equivalent series resistance connected to the output of the ferrite bead at one side and ground at another side;

wherein the ferrite bead and capacitor act to remove switching regulator noise so as to produce an Input voltage supply having a reduced switching regulator noise for the clock circuit.

14. The voltage source according to claim 13, wherein the capacitor is a D case tantalum bulk capacitor.

15. The voltage source according to claim 14, wherein the capacitor has the series resistance of approximately 0.8 Ohms.

16. The voltage source according to claim 13, wherein the ferrite bead has the first resistance of approximately 0.3 Ohms.

17. The circuit according to claim 1, wherein the ferrite bead and the capacitor are provided in an "L" shaped filter configuration.

18. The circuit according to claim 1, wherein the ferrite bead and the capacitor form a resistor divider circuit to assist in noise signal removal.

19. The voltage supply device according to claim 5, wherein the ferrite bead and the capacitor are provided in an "L" shaped filter configuration.

20. The voltage supply device according to claim 5, wherein the ferrite bead and the capacitor form a resistor divider circuit to assist in noise signal removal.

21. The method according to claim 9, wherein the ferrite bead and the capacitor are provided in an "L" shaped filter configuration.

22. The method according to claim 9, wherein the ferrite bead and the capacitor form a resistor divider circuit to assist in noise signal removal.

23. The voltage source according to claim 14, wherein the ferrite bead and the capacitor are provided in an "L" shaped filter configuration.

24. The voltage source according to claim 14, wherein the ferrite bead and the capacitor form a resistor divider circuit to assist in noise signal removal.

* * * * *